US009991364B2

(12) United States Patent
Kwok et al.

(10) Patent No.: US 9,991,364 B2
(45) Date of Patent: *Jun. 5, 2018

(54) TRANSISTOR STRAIN-INDUCING SCHEME

(71) Applicant: Taiwan Semiconductor Manufacturing Co., Ltd., Hsin-Chu (TW)

(72) Inventors: Tsz-Mei Kwok, Hsinchu (TW);
Hsueh-Chang Sung, Zhubei (TW);
Kun-Mu Li, Zhudong Township (TW);
Chii-Horng Li, Zhubei (TW);
Tze-Liang Lee, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days. days.

This patent is subject to a terminal disclaimer.

(21) Appl. No.: 15/612,137

(22) Filed: Jun. 2, 2017

(65) Prior Publication Data
US 2017/0271478 A1    Sep. 21, 2017

Related U.S. Application Data

(60) Continuation of application No. 15/017,698, filed on Feb. 8, 2016, now Pat. No. 9,698,243, which is a
(Continued)

(51) Int. Cl.
*H01L 29/66* (2006.01)
*H01L 29/10* (2006.01)
(Continued)

(52) U.S. Cl.
CPC .... *H01L 29/66636* (2013.01); *H01L 21/0262* (2013.01); *H01L 21/02381* (2013.01);
(Continued)

(58) Field of Classification Search
CPC ............. H01L 29/66636; H01L 29/165; H01L 29/167; H01L 29/7848; H01L 29/1054;
(Continued)

(56) References Cited

U.S. PATENT DOCUMENTS 4,145,703 A     3/1979  Blanchard et al.
4,173,765 A    11/1979  Heald et al.
(Continued)

FOREIGN PATENT DOCUMENTS

CN    101572246 A    11/2009
JP    2008177319 A    7/2008
(Continued)

OTHER PUBLICATIONS

U.S. Appl. No. 14/134,302, filed Dec. 19, 2013.
(Continued)

*Primary Examiner* — Thanhha Pham
(74) *Attorney, Agent, or Firm* — Eschweiler & Potashnik, LLC

(57) ABSTRACT

A transistor device includes a gate structure disposed over a channel region of a semiconductor substrate. A source/drain recess is arranged in the semiconductor substrate alongside the gate structure. A doped silicon-germanium (SiGe) region is disposed within the source/drain recess and has a doping type which is opposite to that of the channel. An un-doped SiGe region is also disposed within the source/drain recess. The un-doped SiGe region underlies the doped SiGe region and comprises different germanium concentrations at different locations within the source/drain recess.

20 Claims, 7 Drawing Sheets

Related U.S. Application Data division of application No. 14/180,490, filed on Feb. 14, 2014, now Pat. No. 9,287,398.

(51) Int. Cl.

| | | |
|---|---|---|
| *H01L 29/737* | (2006.01) | |
| *H01L 29/78* | (2006.01) | |
| *H01L 29/167* | (2006.01) | |
| *H01L 29/165* | (2006.01) | |
| *H01L 21/265* | (2006.01) | |
| *H01L 29/08* | (2006.01) | |
| *H01L 21/02* | (2006.01) | |

(52) U.S. Cl.
CPC .. *H01L 21/02532* (2013.01); *H01L 21/26586* (2013.01); *H01L 29/0847* (2013.01); *H01L 29/1054* (2013.01); *H01L 29/165* (2013.01); *H01L 29/167* (2013.01); *H01L 29/7378* (2013.01); *H01L 29/7842* (2013.01); *H01L 29/7847* (2013.01); *H01L 29/7848* (2013.01)

(58) Field of Classification Search
CPC ............. H01L 29/7378; H01L 29/7847; H01L 29/7842
See application file for complete search history.

(56) References Cited

U.S. PATENT DOCUMENTS

| | | | |
|---|---|---|---|
| 4,214,312 A | 7/1980 | Amir | |
| 4,222,062 A | 9/1980 | Trotter et al. | |
| 4,222,063 A | 9/1980 | Rodgers | |
| 4,407,058 A | 10/1983 | Fatula, Jr. et al. | |
| 4,794,283 A | 12/1988 | Allen et al. | |
| 7,544,577 B2 | 6/2009 | Adam et al. | |
| 7,553,717 B2 | 6/2009 | Chakravarthi et al. | |
| 7,608,515 B2 | 10/2009 | Chen et al. | |
| 7,719,031 B2 | 5/2010 | Saitoh et al. | |
| 7,821,044 B2 | 10/2010 | Bohr et al. | |
| 8,012,820 B2 | 9/2011 | Majumdar et al. | |
| 8,450,165 B2 | 5/2013 | Bohr | |
| 9,287,398 B2 * | 3/2016 | Kwok ................ H01L 29/7848 | |
| 9,691,868 B2 | 6/2017 | Song | |
| 2003/0201461 A1 | 10/2003 | Sato et al. | |
| 2004/0173815 A1 | 9/2004 | Yeo et al. | |
| 2005/0184345 A1 | 8/2005 | Lin et al. | |
| 2005/0285203 A1 | 12/2005 | Fukutome et al. | |
| 2006/0166492 A1 | 7/2006 | Orlowski et al. | |
| 2006/0251800 A1 | 11/2006 | Weidman et al. | |
| 2007/0004123 A1 * | 1/2007 | Bohr ................ H01L 21/30608 438/230 |
| 2007/0210448 A1 | 9/2007 | Wong et al. | |
| 2008/0006818 A1 | 1/2008 | Luo et al. | |
| 2009/0289365 A1 | 11/2009 | Yang et al. | |
| 2010/0244107 A1 | 9/2010 | Kronholz | |
| 2012/0097977 A1 | 4/2012 | Yamaguchi | |
| 2012/0138897 A1 | 6/2012 | Lin et al. | |
| 2012/0153387 A1 | 6/2012 | Murthy et al. | |
| 2012/0181625 A1 * | 7/2012 | Kwok ................ H01L 29/165 257/408 |
| 2013/0069172 A1 | 3/2013 | Liao et al. | |
| 2013/0109144 A1 | 5/2013 | Kim et al. | |
| 2013/0207166 A1 | 8/2013 | Chen et al. | |
| 2014/0027909 A1 | 1/2014 | Gstrein et al. | |
| 2014/0070377 A1 | 3/2014 | Yu et al. | |
| 2014/0175556 A1 | 6/2014 | Chen et al. | |
| 2014/0335674 A1 | 11/2014 | Liao et al. | |
| 2015/0236157 A1 | 8/2015 | Kwok et al. | |

FOREIGN PATENT DOCUMENTS

| | | |
|---|---|---|
| JP | 2008218725 A | 9/2008 |
| KR | 20130045716 A | 5/2013 |
| TW | I285954 B | 8/2007 |
| TW | 201242022 A | 10/2012 |
| WO | 2012087404 A1 | 6/2012 |

OTHER PUBLICATIONS

Non Final Office Action Dated Sep. 3, 2015 U.S. Appl. No. 14/134,302.
Non-Final Office Action dated Jun. 5, 2015 for U.S. Appl. No. 14/180,490.
Notice of Allowance dated Nov. 6, 2015 for U.S. Appl. No. 14/180,490.
Final Office Action Dated Aug. 16, 2016 U.S. Appl. No. 14/134,302.
Notice of Allowance Dated Jan. 23, 2017 U.S. Appl. No. 14/134,302.
Non-Final Office Action dated Nov. 8, 2017 in connection with U.S. Appl. No. 15/589,259.

* cited by examiner

TRANSISTOR STRAIN-INDUCING SCHEME

REFERENCE TO RELATED APPLICATIONS

This Application is a Continuation of U.S. application Ser. No. 15/017,698 filed on Feb. 8, 2016, which is a Divisional of U.S. application Ser. No. 14/180,490 filed on Feb. 14, 2014 (now U.S. Pat. No. 9,287,398 issued on Mar. 15, 2016). The contents of the above-referenced matters are hereby incorporated by reference in their entirety.

BACKGROUND

The following disclosure relates to semiconductor manufacturing methods. In particular, the following disclosure relates to method for forming a contact to a semiconductor device.

The semiconductor industry has continually improved the performance of integrated chips by scaling the minimum feature size of integrated chip (IC) components according to Moore's law. However, in recent years, scaling of some IC components has become increasingly difficult. To alleviate the demands of scaling, the semiconductor industry has looked for other ways in which to improve the performance of integrated chips.

Strain engineering is often utilized to improve the performance of transistor devices. For example, by inducing a compressive stress onto a channel region of a PMOS transistor, the mobility and performance of the transistor is improved. By using strain engineering to improve transistor performance, the demands to scale an integrated chip design (e.g., to further reduce the gate dielectric thickness) are alleviated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
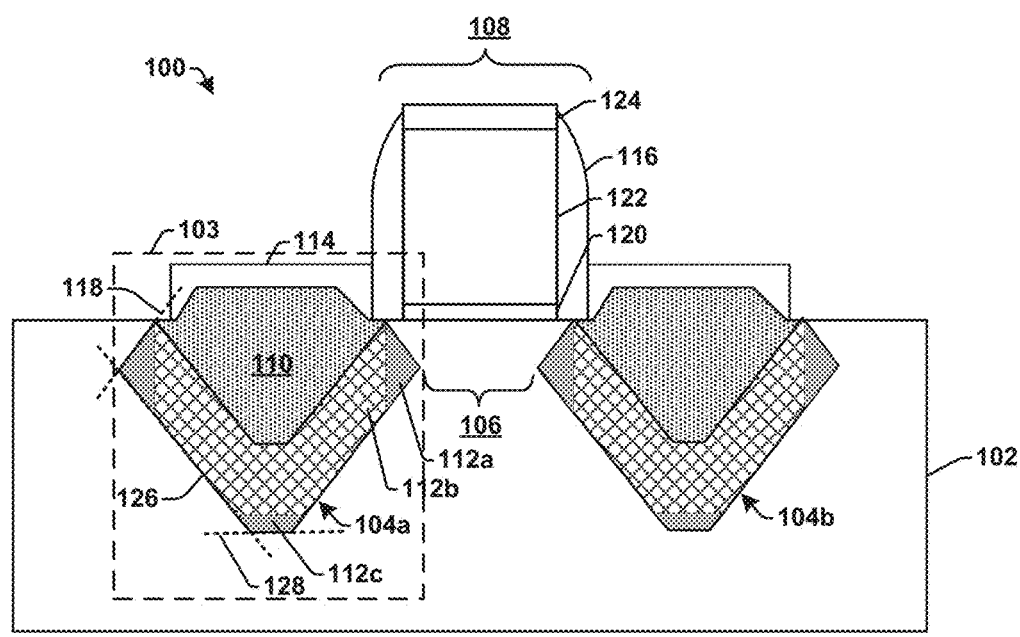
FIG. 1 illustrates a cross-sectional view of some embodiments of a strained channel transistor device.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

A strained channel MOSFET (metal-oxide-semiconductor field effect transistor) device may be formed by forming strain-inducing source and drain regions at opposing ends of a channel region. The strain-inducing source and drain regions are formed by forming source and drain recesses within a substrate, and subsequently depositing strain-inducing material within the source and drain recesses. For example, a germanium-containing material, such as silicon germanium (SiGe), may be deposited within a source or drain recess of a p-channel MOSFET to provide for a lateral compressive strain toward a channel region therebetween. This lateral compressive strain in the channel region enhances the mobility of holes, which are the majority carriers in the example p-channel MOSFET. Similarly, a carbon-containing material such as silicon carbide (SiC) may be utilized to induce tensile strain that enhances electron mobility for an n-channel MOSFET.

For channel mobility enhancement in advanced PMOS technology nodes (e.g., 28 nm gate widths and smaller), an in-situ boron doping process may be performed during epitaxial growth of SiGe to form a doped SiGe source/drain region. The in-situ boron doping during SiGe epitaxy advantageously provides an abrupt junction, a small source-drain resistance, and a small contact resistance. It also alleviates lattice mismatch between SiGe layers and silicon substrates. Unfortunately, however, the boron dopants can out-diffuse from the doped SiGe source/drain regions to under the channel region of the device, leading to short channel effects which become significant for small feature sizes.

To limit such short-channel effects from arising, the present disclosure relates to a transistor device having a doped strain-inducing source/drain region and an underlying, un-doped strain-inducing source/drain region, which are both arranged in a single source/drain recess. The un-doped strain-inducing region retards diffusion of dopants from the doped strain-inducing source/drain region to the channel region of the transistor. In particular, the un-doped strain-inducing region can have several different regions with different concentrations of strain-inducing component. The different concentrations of strain-inducing component can control the extent to which dopants diffuse therethrough. For example, in a case where the un-doped strain-inducing region is made of SiGe (with Ge being the strain-inducing component), different concentrations of Ge can correspond to different diffusion rates for boron from a doped SiGe source/drain region to the channel region; with lower germanium concentrations corresponding to increased boron out-diffusion, and higher germanium concentrations corresponding to reduced boron out-diffusion. As a result, the strain-inducing component concentrations can be tuned to provide less dopant diffusion at relatively deep source/drain positions to prevent short channel effects; and to also provide more dopant diffusion at relatively shallow source/drain positions, while still maintaining suitable stress to the channel for improved carrier mobility. These techniques can be practiced for n-type and p-type transistors, both of which are contemplated as falling within the scope of the present disclosure.

FIG. 1 illustrates a cross-sectional view of some embodiments of a strained channel transistor device 100. A gate structure 108 is disposed on a semiconductor substrate 102. In various embodiments, the semiconductor substrate 102 may comprise any type of semiconductor body (e.g., silicon, silicon-germanium, silicon-on-insulator, etc.) such as a semiconductor wafer and/or one or more die on a semiconductor wafer, as well as any other type of semiconductor and/or epitaxial layers associated therewith. Source/drain recess, for example, 103, is formed alongside opposing edges of the gate structure 108. The source/drain region 104a/104b is formed in the source/drain recess and comprises a doped strain-inducing region 110 and an un-doped strain-inducing region 112. The doped strain-inducing region 110 can comprise, for example, a SiGe region that is doped with boron, for example. The un-doped strain-inducing region 112 can comprise, for example, undoped or intrinsic SiGe and underlies the doped strain-inducing region 110 within the source/drain recess.

The un-doped strain-inducing region 112 can include different regions with different concentrations of strain-inducing components. A first un-doped strain-inducing layer 112a can have a first strain-inducing component concentration that is lower than a second strain-inducing component concentration of an underlying second un-doped strain-inducing layer 112b. The first un-doped strain-inducing layer 112a has an upper <111> plane 118 abutting a top surface of the source/drain recess 103 and the underlying second un-doped strain-inducing layer 112b has a lower <111> plane 126. In some embodiments, there is a third un-doped strain-inducing layer 112c with a <100> plane 128 abutting a bottom surface of the source/drain recess 103. With a lower strain-inducing component concentration, the first un-doped strain-inducing layer 112a introduces more boron diffusion from the first doped strain-inducing material 110 to the channel region 106 of the transistor 100. With a higher strain-inducing component concentration, the second un-doped strain-inducing layer 112b retards boron diffusion from the first un-doped doped strain-inducing region 110 under the channel region 106 so short channel effects are reduced.

In some embodiments, the gate structure 108 may comprise a stacked structure comprising a gate dielectric layer 120, a gate electrode layer 122, and a hardmask layer 124. The gate dielectric layer 120 is disposed onto the semiconductor substrate 102. The gate electrode layer 122 (e.g., poly-silicon, replacement metal, etc.) is disposed onto the gate dielectric layer 120, and the hardmask layer 124 (e.g., $SiO_2$ or other dielectric) is disposed onto the gate electrode layer 122. In some embodiments, sidewall spacers 116 are located on opposing sides of the gate structure 108. The sidewall spacers 116 are configured to isolate the gate electrode layer 122 from the strained source and drain regions, 104a and 104b.

The strained source/drain region, 104a/104b is configured to induce a strain (e.g., a compressive strain or a tensile strain) on the channel region 106.

In some embodiments, the strain-inducing material may comprise silicon germanium and the strain-inducing component may comprise germanium. In such embodiments, the germanium is configured to induce a strain on the channel region 106 due to the difference in lattice constants of germanium (Ge) and silicon (Si). In other embodiments, the strain-inducing material may comprise an alternative material, such as silicon carbide (SiC), for example.

In some embodiments, the strain-inducing material (e.g., SiGe) may comprise a plurality of distinct epitaxial layers disposed within recesses of the strained source and drain regions, 104a and 104b. In some embodiments, the plurality of distinct epitaxial layers may respectively have different strain-inducing component concentration profiles (e.g., germanium concentration profiles) that are discontinuous at an intersection between abutting layers.

Although strained source and drain regions, 104a and 104b, are illustrated in strained channel transistor device 100 as tri-layer regions, it will be appreciated that the disclosed strained source and drain regions, 104a and 104b, are not limited to such layers. In other embodiments, the strained source and drain regions, 104a and 104b, may comprise additional layers (e.g., a fourth SiGe layer, a fifth SiGe layer, etc.).

Figure 2:
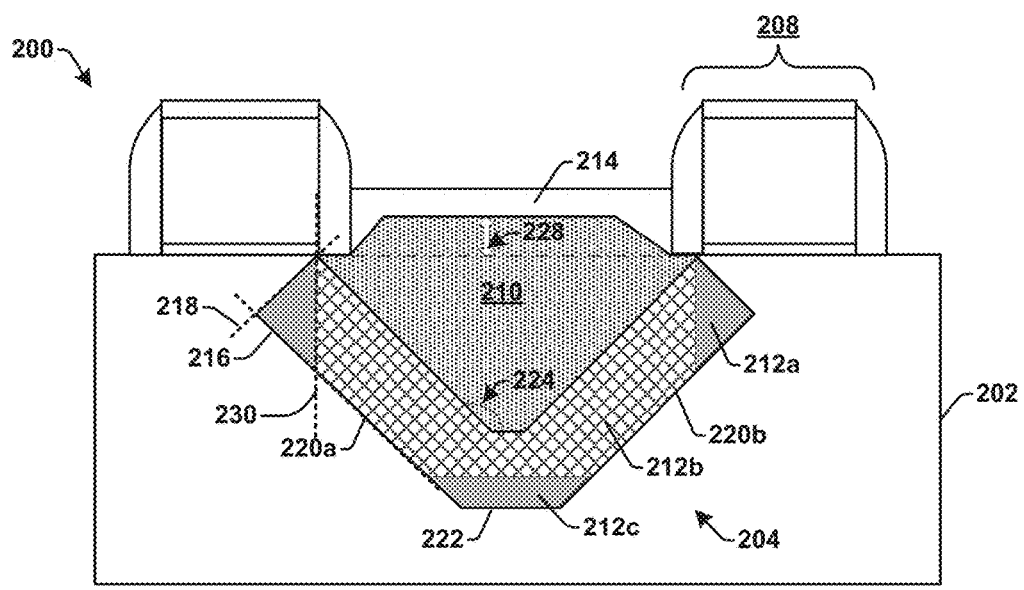
FIG. 2 illustrates a cross-sectional view of some alternative embodiments of a strained channel transistor device.

FIG. 2 illustrates a cross-sectional view of some alternative embodiments of a strained channel transistor device 200.

Strained channel transistor device 200 comprises a gate structure 208 disposed on a semiconductor substrate 202 and a source/drain region 204 along a side of the gate structure 208 within a source/drain recess in the semiconductor substrate 202 having an anisotropic etch profile that provides for a diamond-shape or "V" shaped cavity in the semiconductor substrate 202. The "V" shaped cavity comprises a <100> surface 222 flanked by <111> surfaces, 220a and 220b.

The source/drain region 204 comprises a plurality of un-doped silicon germanium (SiGe) layers such as 212a, 212b and 212c and an overlying doped silicon germanium (SiGeB) layer 210. An outer un-doped SiGe layer 212a with a first germanium concentration is located abutting a top surface of the source/drain recess and a lower un-doped SiGe layer 212c with a second germanium concentration is located below one or more additional un-doped SiGe layers. An inner un-doped SiGe layer 212b with a third germanium concentration is located between the outer un-doped SiGe layer and the lower un-doped SiGe layer. The outer un-doped SiGe layer is disposed onto two intersected <111> plane side surfaces 216 and 218 of the source/drain recess forming a tip region. The lower un-doped SiGe layer 212c is disposed onto the <100> surface 222 which are collectively referred to herein as a bottom surface. The inner un-doped SiGe layer is disposed onto a lower <111> plane side surface 220 and a <110> plane side surface 230 between the outer un-doped SiGe layer and the lower un-doped SiGe layer. The germanium concentrations of the un-doped SiGe layers 212 can be constant different values that the first and second germanium concentrations are lower than the third germanium concentration. Or the germanium concentrations can be increasing, decreasing, continuous or discontinuous profiles. The germanium concentration profiles can be discontinuous in order to achieve better performance. As an example, the first and second germanium concentrations of the outer and lower un-doped SiGe layers can range between approximately 5% and approximately 25%. The third germanium concentration of the inner un-doped SiGe layer can range between approximately 15% and approximately 35%. A germanium concentration of the doped SiGe layer 210 can range between approximately 35% and approximately 70%. The transistor device 200 can further comprise a silicon cap layer 214 comprising un-doped pure silicon or a SiGe cap layer comprising a germanium concentration for example, is less than approximately 35%. It will be appreciated that since the source/drain recess has the <100> surface such as 222 and the <111> surface such as 220 and 218, that the term overlying is not limited to strictly vertically overlying. For example, the term overlying may also mean overlying along a line that is normal to a <111> surface (e.g., overlying along a 45° angle).

Figure 3:
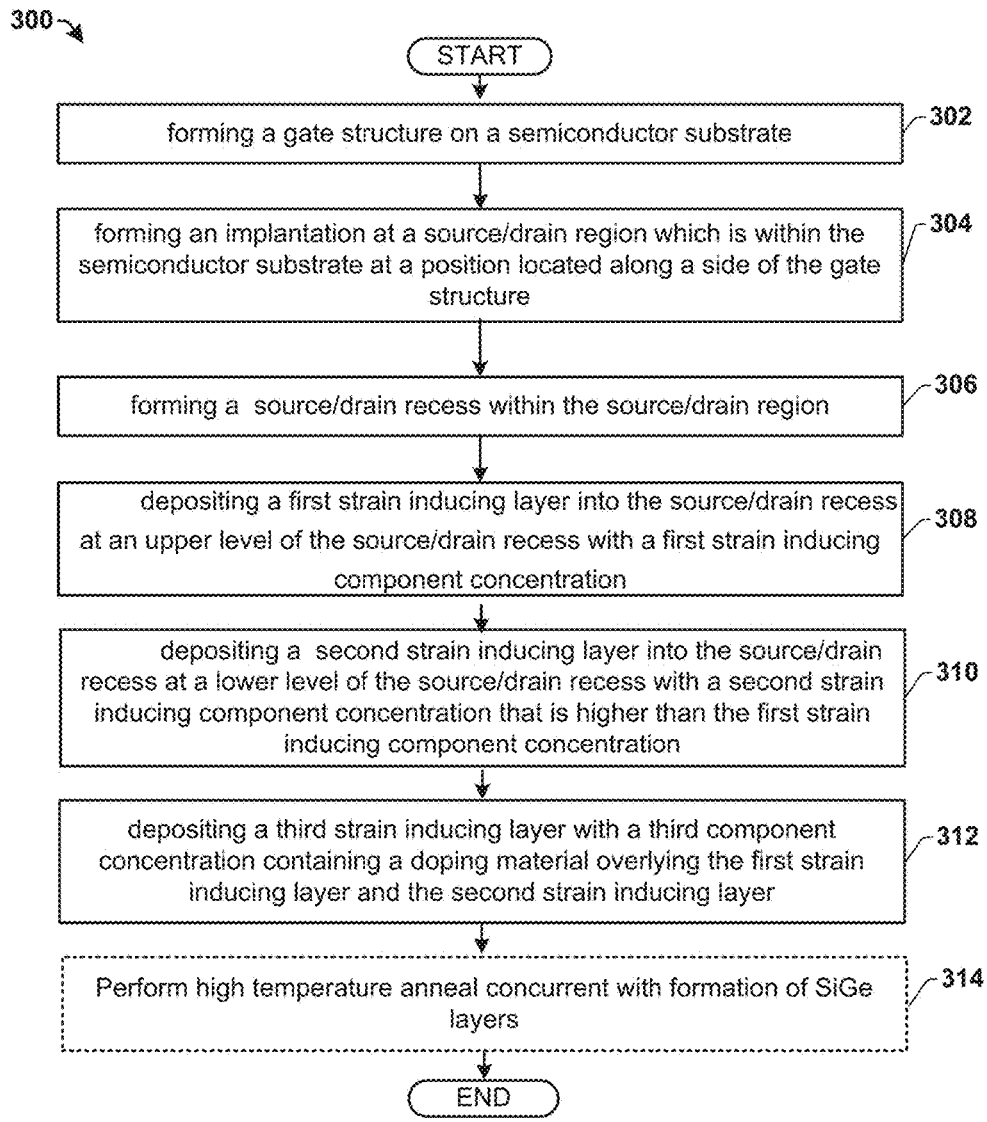
FIG. 3 illustrates a flow diagram of some embodiments of a method of forming a strained channel transistor device.

FIG. 3 illustrates a flow diagram of some embodiments of a method 300 of forming a strained channel transistor device.

While disclosed methods (e.g., methods 300) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 4A:
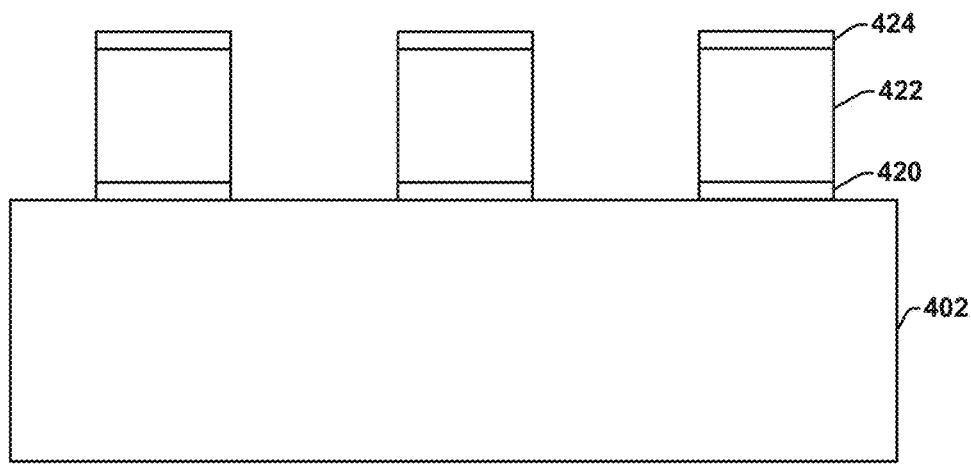
FIGS. 4A-4G illustrate exemplary intermediate steps of a fabrication method of a strained channel transistor device according to some embodiments.

At 302, as an example shown in FIG. 4a, a gate structure is formed on a semiconductor substrate. In various embodiments, the semiconductor substrate may comprise any type of semiconductor body (e.g., silicon, silicon-germanium, silicon-on-insulator, etc.) such as a semiconductor wafer and/or one or more die on a semiconductor wafer, as well as any other type of semiconductor and/or epitaxial layers associated therewith.

Figure 4B:
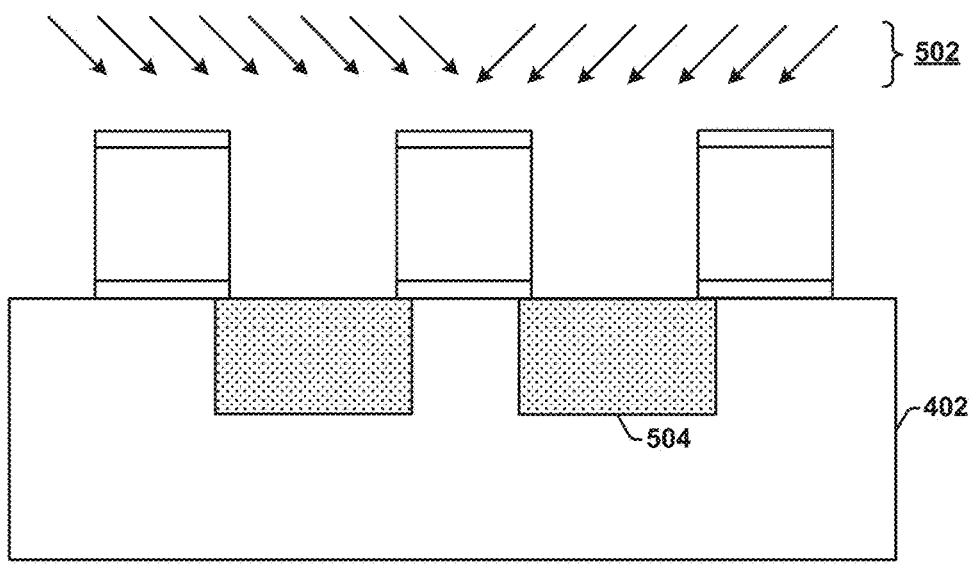

At 304, as an example shown in FIG. 4b, an implantation is formed at a source/drain region which is within the semiconductor substrate at a position located along a side of the gate structure. In some embodiments, a pocket implantation and a selective lightly doped drain (LDD) implant is performed in succession.

Figure 4C:
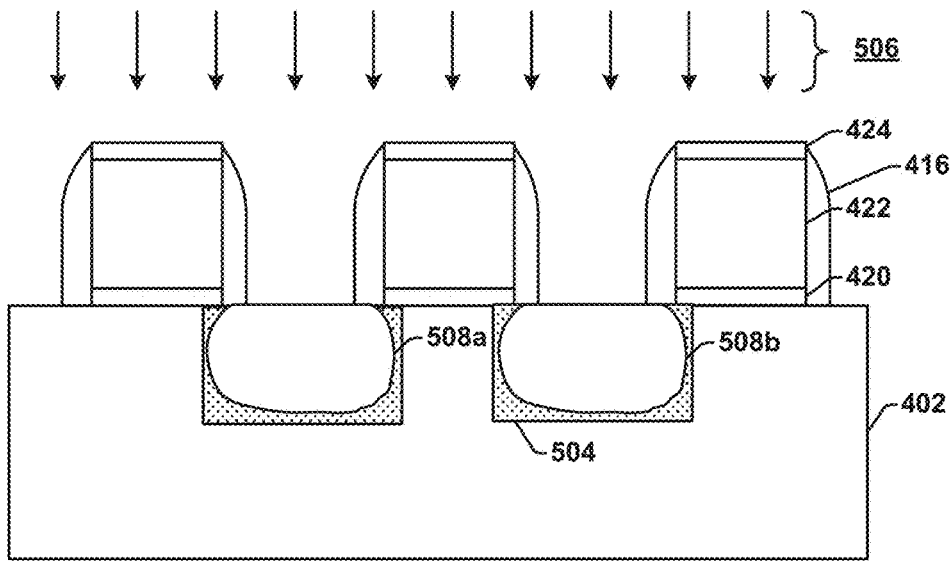
Figure 4D:
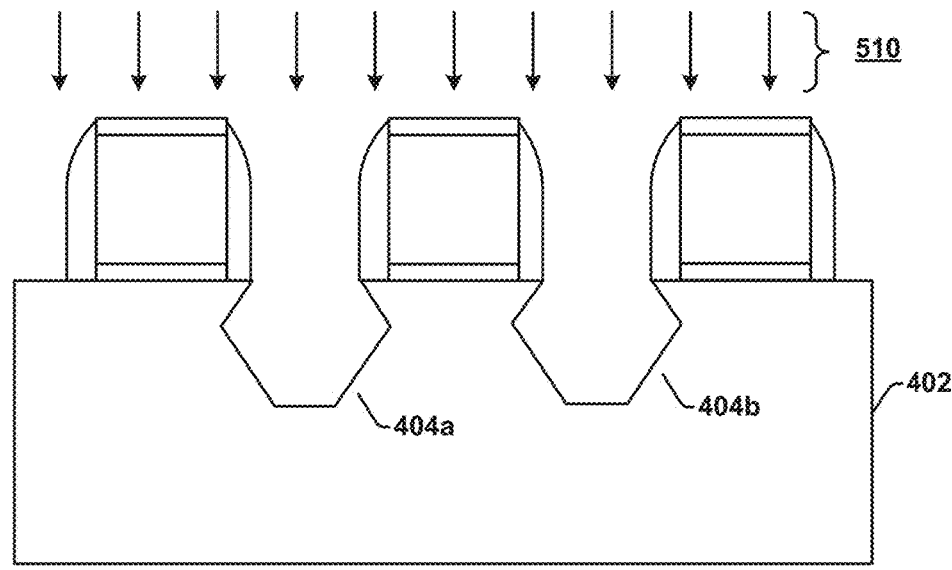

At 306, as an example shown in FIG. 4c and/or FIG. 4d, a source/drain recess is formed within the source/drain region in the semiconductor substrate. In some embodiments, a plurality of etching processes may be used to form the source/drain recess. For example, in some embodiments, an isotropic etching process may be performed on the semiconductor substrate to form a recess in the semiconductor substrate. An anisotropic etch may then be performed to achieve a V shaped source/drain recess.

At 308, a first un-doped strain-inducing layer is deposited into the source/drain recess at an upper level of the source/drain recess with a first un-doped strain-inducing component concentration. In some embodiments, the strain-inducing component may comprise germanium.

In some embodiments, the strain-inducing material may be deposited within the source/drain recess as a plurality of distinct epitaxial layers. In some embodiments, the plurality of distinct epitaxial layers may be deposited in-situ within a same processing chamber (i.e., without removing the semiconductor substrate from the processing chamber). The deposition can be applied by Physical Vapor Deposition (PVD), Chemical Vapor Deposition (CVD), or Epitaxy, among other techniques. At 310, a second un-doped strain-inducing layer is deposited into the source/drain recess at a lower level of the source/drain recess with a second strain-inducing component concentration that is higher than the first strain-inducing component concentration.

At 312, a doped strain-inducing layer with a third component concentration containing a doping material is deposited overlying the first un-doped strain-inducing layer and the second un-doped strain-inducing layer. The third component concentration can be either higher or lower than the first or the second strain-inducing component concentration.

At 314, a high temperature anneal may be performed concurrently with the deposition multi-layer SiGe layers, in some embodiments. The high temperature anneal may be performed for a time of between approximately 30 s and approximately 240 s within a processing chamber held at a temperature in a range of between approximately 700° C. and approximately 900° C. and at a pressure having a range of between approximately 10 torr and approximately 200 torr.

Figure 4E:
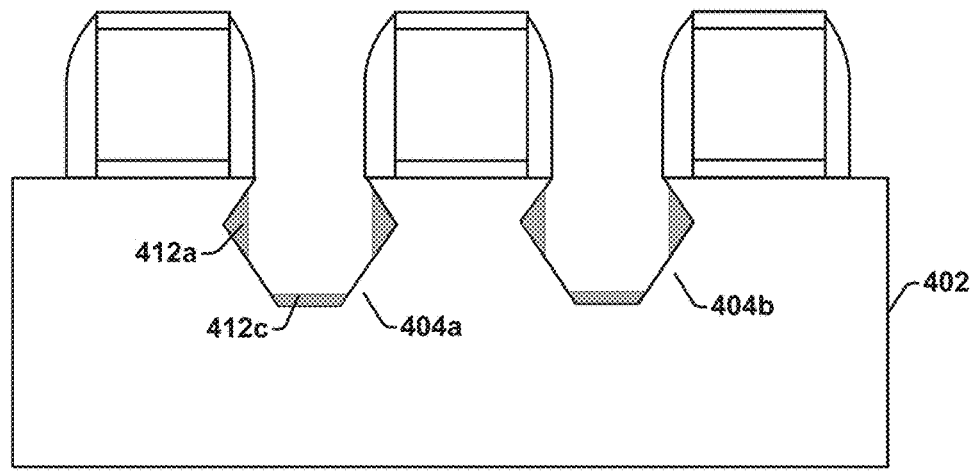
Figure 4F:
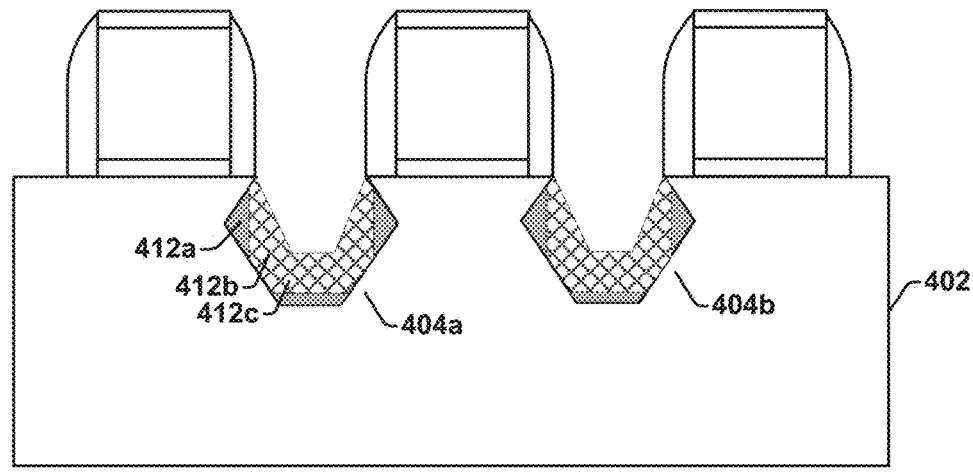
Figure 4G:
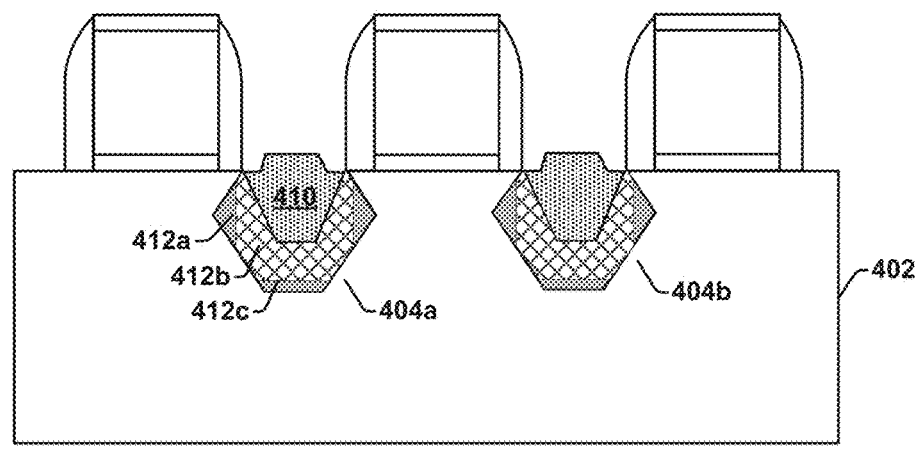

FIGS. 4a-4g illustrate some embodiments of cross-sectional views of a semiconductor substrate showing a method of forming a strained channel transistor device. Although FIGS. 4a-4g are described in relation to method 300, it will be appreciated that the structures disclosed in FIGS. 4g-4g are not limited to such a method.

As shown in FIG. 4a, a gate structure is formed onto a semiconductor substrate 402. The gate structure comprises a gate dielectric layer 420 that is selectively formed onto the semiconductor substrate 402. The gate dielectric layer 420 may be formed by a deposition process (e.g., a chemical vapor deposition, physical vapor deposition, etc.) or by thermal oxidation. In some embodiments, the gate dielectric layer 420 may comprise an insulating material, such as silicon dioxide ($SiO_2$) or a high-k dielectric material, for example.

A gate electrode layer 422 is formed over the gate dielectric layer 420. The gate electrode layer 422 may comprise polysilicon or a metal gate material, deposited by way of a deposition process. A hardmask layer 424 is then selectively formed over the gate electrode layer 422 and the gate dielectric layer 420. The gate dielectric layer 420 and the gate electrode layer 422 are subsequently etched according to the hardmask layer 424 to define a gate area.

As shown in FIG. 4b, one or more implantations 502 are performed to introduce dopants into the semiconductor substrate 402 and to thereby form implantation areas 504 disposed between gate structures. In some embodiments, the one or more implantations 502 may comprise a pocket implantation. The pocket implant regions may extend to positions that underlie the stacked gate structure. The pocket implantation improves anti-punch through control of a transistor device. In various embodiments, the pocket implantation may comprise an arsenic (As) dopant and/or a phosphorus (P) dopant. In some embodiments, the pocket implantation may be performed at an energy having a range of between approximately 20 KeV (kiloelectron volts) and approximately 80 KeV, with a dose having a range of between approximately 1e12 atoms/$cm^2$ and approximately 1e14 atoms/$cm^2$, and at a tile angle having a range of between approximately 15° and approximately 45°.

In other embodiments, the one or more implantations 502 may comprise a lightly doped drain (LDD) implantation performed on the semiconductor substrate 402. The LDD implantation improves SCE (short channel effects) control. In various embodiments, the LDD implantation may comprise a boron diflouride ($BF_2$) dopant, or a boron (B) dopant. The LDD implantation may be performed at an energy having a range of between approximately 1 KeV and approximately 10 KeV, with a dose having a range of between approximately 1e13 atoms/$cm^2$ and approximately 1e16 atoms/$cm^2$, and at a tile angle having a range of between approximately 0° and approximately 30°

As shown in FIG. 4c, the semiconductor substrate 402 is selectively etched to form source and drain recesses, 508a and 508b. In some embodiments, the source and drain recesses, 508a and 508b may be formed by a multi-etch process. The semiconductor substrate 402 may be exposed to an isotropic etchant 506 configured to produce recesses, 508a and 508b, having an isotropic etch profile (e.g., a U-shaped etch profile). In some embodiments, the isotropic etchant 506 may comprise a dry etchant. For example, in some embodiments, the isotropic etchant 506 may comprise a dry etchant using a processing gas including tetrafluoromethane ($CF_4$), chlorine gas ($Cl_2$), nitrogen trifluoride ($NF_3$), sulfur hexafluoride ($SF_6$), and/or helium (He).

As shown in FIG. 4d, the semiconductor substrate 402 may be further exposed to an anisotropic etchant 510. The anisotropic etchant 510 further etches recesses, 508a and 508b, to produce source and drain recesses, 404a and 404b, having an anisotropic etch profile. In some embodiments, the anisotropic etchant 510 may comprise a wet etchant. For example, the anisotropic etchant 510 may comprise tetramethylammonium hydroxide (TMAH). TMAH produces <111> planes to form a 'V' shaped or diamond shaped recess with a tilt angle about 110 to about 140 degree. In some embodiments, the semiconductor substrate 402 may be exposed to a TMAH etchant comprising an aqueous solution having a concentration of between 1-30% within a processing chamber held at a temperature of between approximately 20° C. and approximately 100° C., to form a recess depth of between approximately 300 Å and approximately 1000 Å.

In some embodiments, sidewall spacers 416 may be formed on opposing sides of the gate structure prior to formation of the source and drain recesses, 404a and 404b. In some embodiments, the sidewall spacers 416 may be formed by depositing nitride onto the semiconductor substrate 402 and selectively etching the nitride to form the sidewall spacers 416.

As shown in FIG. 4e to FIG. 4g, a multi-layer SiGe growth process is performed to deposit a strain-inducing SiGe material within the source and drain recesses, 404a and 404b. In some embodiments, a pre-clean process is performed to remove surface defects and/or contaminations from the source and drain recesses prior to deposition of a silicon-germanium (SiGe) material within the source and drain recesses. In some embodiments, the pre-clean process may comprise a wet clean process (e.g., having a hydrofluoric acid (HF) base) or a dry clean process (e.g., using pre-Ni silicide (SiCoNi) or Certas).

As shown in FIG. 4e, a first un-doped SiGe layer 412a and a bottom un-doped SiGe layer 412c are deposited onto a tip region and a bottom region of the source and drain recesses, 404a and 404b. The tip region comprises an intersection of two side surfaces with <111> planes. A first epitaxial rate at the bottom region and the tip region are faster than a second epitaxial rate at a side wall region comprises a side surface with a <111> plane. In some embodiments, the first un-doped SiGe layer has a thickness about 2-10 nm and the bottom un-doped SiGe layer has a thickness about 5-15 nm. A relatively low germanium concentration is formed. A first Ge/Si gas flow ratio is applied during the deposition. For example, a gas flow ratio of Ge/Si from about 0.001 to about 0.01 can be applied.

As shown in FIG. 4f, a second un-doped SiGe layer 412b is deposited onto the first un-doped SiGe layer and the bottom un-doped SiGe layer. The second region comprises a side wall region with a side surface with a <111> plane. Notably, the growth of the second un-doped SiGE layer is slower than that of the first un-doped SiGe layer and the bottom un-doped SiGe layer. In some embodiments, the second un-doped SiGe layer has a thickness of about 5-15 nm. A relative high germanium concentration is formed. It can be realized by a second Ge/Si gas flow ratio that is larger than the first Ge/Si gas flow ratio. For example, a gas flow ratio of Ge/Si from about 0.05 to about 0.05 can be applied.

As shown in FIG. 4g, a doped SiGe layer 410, which is doped with boron, is deposited onto the second un-doped SiGe layer. It can be grown higher than a top surface of the substrate, for example, about 0-15 nm higher. In some embodiments, an additional Si or SiGe cap layer about 5-15 nm can be formed on the SiGe layer afterwards.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figures. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to a transistor device having a strained source/drain region comprising a first strained inducing layer at shallow level with smaller strained inducing component concentration, an underlying second strained inducing layer at deeper level with larger strained inducing component concentration and an additional doping layer.

In some embodiments, the present disclosure relates to a transistor device. The transistor includes a gate structure arranged over a semiconductor substrate. A source/drain recess is arranged in the semiconductor substrate alongside the gate structure. A first strain-inducing region is disposed within the source/drain recess and is made up of a compound semiconductor material that is doped with n-type or p-type dopant impurities. A second strain-inducing region is disposed within the source/drain recess so as to underlie the first strain-inducing region. The second strain-inducing region is made up of the compound semiconductor material in un-doped format. A stoichiometry of elements making up the compound semiconductor material is different at different locations within the second strain-inducing region.

In other embodiments, the present disclosure relates to a transistor device. A transistor device includes a gate structure disposed over a channel region of a semiconductor substrate. The channel region has a first doping type. A source/drain recess is arranged in the semiconductor substrate alongside the gate structure. A doped silicon-germanium (SiGe) region is disposed within the source/drain recess and has a second doping type which is opposite the first doping type. An un-doped SiGe region is disposed within the source/drain recess and underlies the doped SiGe region. The un-doped SiGe region comprises different germanium concentrations at different locations within the source/drain recess.

In yet other embodiments, the present disclosure relates to a method of forming a transistor device. The method comprises forming a gate structure on a semiconductor substrate. The method further comprises forming a source/drain recess within the semiconductor substrate at a position located along a side of the gate structure. The method further comprises depositing a first un-doped strain-inducing layer into the source/drain recess at an upper level of the source/drain recess with a first strain-inducing component concentration. The method further comprises depositing a second un-doped strain-inducing layer into the source/drain recess at a lower level of the source/drain recess with a second strain-inducing component concentration that is higher than the first strain-inducing component concentration. The method further comprises depositing a doped strain-inducing layer with a third strain-inducing component concentration into the source/drain recess.

What is claimed is:

1. An integrated circuit, comprising:
   a substantially v-shaped recess within a semiconductor substrate, the substantially v-shaped recess having outermost lateral tips that are spaced beneath an upper surface of the semiconductor substrate;
   outer un-doped strain-inducing regions arranged in the outermost lateral tips of the substantially v-shaped recess, the outer un-doped strain-inducing regions having a first strain-inducing component at a first concentration; and
   an intermediate un-doped strain-inducing region which extends between the outer un-doped strain-inducing regions and which extends along a lower angled sidewall of the substantially v-shaped recess without completely filling the substantially v-shaped recess, the intermediate un-doped strain-inducing region having a second strain-inducing component at a second concentration that differs from the first concentration, wherein the second concentration is greater than the first concentration.

2. The integrated circuit of claim 1, further comprising:
   a doped source/drain region over the intermediate un-doped strain-inducing region, the doped source/drain region filling the substantially v-shaped recess.

3. The integrated circuit of claim 1, wherein the outer un-doped strain-inducing regions and the intermediate un-doped strain-inducing region each comprise silicon germanium.

4. The integrated circuit of claim 1, further comprising:
   a lower un-doped strain-inducing region arranged in a lowermost portion of the substantially v-shaped recess and arranged under a central portion of the intermediate un-doped strain-inducing region.

5. The integrated circuit of claim 4, wherein the outer un-doped strain-inducing regions, the lower un-doped strain-inducing region, and the intermediate un-doped strain-inducing region each comprise silicon germanium.

6. The integrated circuit of claim 4, wherein the lower un-doped strain-inducing region has the first strain-inducing component at the first concentration.

7. The integrated circuit of claim 1, wherein the first and second strain-inducing components comprise germanium or carbon.

8. The integrated circuit of claim 1, wherein the semiconductor substrate is made of silicon and the outer un-doped strain-inducing regions and the intermediate un-doped strain-inducing region are made of silicon germanium or silicon carbide.

9. An integrated circuit, comprising:
   a substantially v-shaped recess arranged within a semiconductor substrate;
   a lower un-doped strain-inducing region arranged in a lowermost portion of the substantially v-shaped recess, the lower un-doped strain-inducing region having a first strain-inducing component at a first concentration; and
   an intermediate un-doped strain-inducing region which extends over the lower un-doped strain-inducing region and which extends along a lower angled sidewall of the substantially v-shaped recess while leaving a central upper portion of the substantially v-shaped recess unfilled, the intermediate un-doped strain-inducing region having a second strain-inducing component at a second concentration that is greater than the first concentration.

10. The integrated circuit of claim 9, further comprising:
    a doped source/drain region over the intermediate un-doped strain-inducing region, the doped source/drain region filling the central upper portion of the substantially v-shaped recess.

11. The integrated circuit of claim 10, wherein the doped source/drain region has an uppermost portion that extends upward past an upper surface of the semiconductor substrate.

12. The integrated circuit of claim 9, further comprising:
    outer un-doped strain-inducing regions in outermost lateral tips of the substantially v-shaped recess and spaced apart from one another by the intermediate un-doped strain-inducing region, the outer un-doped strain-inducing regions having the first strain-inducing component at the first concentration.

13. The integrated circuit of claim 12, wherein the semiconductor substrate is made of silicon and the outer un-doped strain-inducing regions and the intermediate un-doped strain-inducing regions are made of silicon germanium or silicon carbide.

14. The integrated circuit of claim 9, wherein the first and second strain-inducing components comprise germanium or carbon.

15. The integrated circuit of claim 9:
    wherein the first concentration is a germanium concentration that ranges between approximately 5% and approximately 25%; and
    wherein the second concentration is a germanium concentration that ranges between approximately 15% and approximately 35%.

16. An integrated circuit, comprising:
    a first substantially v-shaped recess arranged in a semiconductor substrate;
    a doped silicon-germanium (SiGe) region disposed within a central, upper portion of the first substantially v-shaped recess; and an un-doped SiGe region disposed within the first substantially v-shaped recess and underlying the doped SiGe region, wherein the un-doped SiGe region comprises:

a lower un-doped SiGe region contacting a bottom surface of the first substantially v-shaped recess and having a first germanium concentration; and an intermediate un-doped SiGe region between the doped SiGe region and the lower un-doped SiGe region, the intermediate un-doped SiGe region having a second germanium concentration that is higher than the first germanium concentration.

17. The integrated circuit of claim 16, further comprising:
a second substantially v-shaped recess arranged in the semiconductor substrate;
a channel region in the semiconductor substrate and separating the first substantially v-shaped recess from the second substantially v-shaped recess; and
a gate structure arranged over the channel region.

18. The integrated circuit of claim 16, wherein the un-doped SiGe region further comprises:
outer un-doped SiGe regions arranged in outermost lateral tips of the substantially v-shaped recess, the outer un-doped SiGe regions having the first germanium concentration.

19. The integrated circuit of claim 18, wherein the first germanium concentration ranges between approximately 5% and approximately 25%.

20. The integrated circuit of claim 16, wherein the second germanium concentration ranges between approximately 15% and approximately 35%.

* * * * *